(12) United States Patent
van Zelm et al.

(10) Patent No.: US 8,213,880 B2
(45) Date of Patent: Jul. 3, 2012

(54) MINIMUM FEEDBACK RADIO ARCHITECTURE WITH DIGITALLY CONFIGURABLE ADAPTIVE LINEARIZATION

(75) Inventors: John-Peter van Zelm, Calgary (CA); Peter Rashev, Calgary (CA)

(73) Assignee: Rockstar Bidco, LP, New York, NY (US)

( * ) Notice: Subject to any disclaimer, the term of this patent is extended or adjusted under 35 U.S.C. 154(b) by 883 days.

(21) Appl. No.: 12/252,065

(22) Filed: Oct. 15, 2008

(65) Prior Publication Data
US 2010/0090762 A1    Apr. 15, 2010

(51) Int. Cl.
*H04B 1/04* (2006.01)
*H01Q 11/12* (2006.01)
(52) U.S. Cl. .... 455/91; 455/114.2; 455/126; 455/127.3; 375/296
(58) Field of Classification Search .............. 455/91, 455/101, 114.2–114.3, 126, 127.1–127.3; 375/295–297, 299
See application file for complete search history.

(56) References Cited

U.S. PATENT DOCUMENTS

| | | | | |
|---|---|---|---|---|
| 6,006,111 | A * | 12/1999 | Rowland | 455/561 |
| 6,697,436 | B1 * | 2/2004 | Wright et al. | 375/296 |
| 6,798,843 | B1 | 9/2004 | Wright et al. | |
| 7,139,539 | B2 * | 11/2006 | Chun | 455/127.1 |
| 7,206,355 | B2 * | 4/2007 | McGowan et al. | 375/295 |
| 7,230,478 | B2 * | 6/2007 | Hoffman et al. | 330/2 |
| 7,248,656 | B2 * | 7/2007 | da Silveira et al. | 375/346 |
| 7,251,290 | B2 | 7/2007 | Rashev et al. | |
| 7,409,010 | B2 * | 8/2008 | McHenry | 375/296 |
| 7,415,252 | B2 | 8/2008 | Jelonnek | |
| 7,587,652 | B2 * | 9/2009 | Nishizawa et al. | 714/746 |

(Continued)

FOREIGN PATENT DOCUMENTS
EP    2178204 A1    4/2010

OTHER PUBLICATIONS

Foreign communication from a related application—European Search Report, EP09012747, Feb. 3, 2010, 6 pages.

(Continued)

*Primary Examiner* — Simon Nguyen
(74) *Attorney, Agent, or Firm* — Conley Rose, P.C.; Rodney B. Carroll; Bernard Tiegerman

(57) ABSTRACT

Included is a radio transmission system comprising a plurality of power amplifiers (PAs); a plurality of Volterra Engine (VE) linearizers corresponding to the PAs; a plurality of feedback loops corresponding to the PAs; at least one digital hybrid matrix (DHM) coupled to the VE linearizers; and an analog hybrid matrix (AHM) coupled to the PAs, wherein the feedback loops are connected to the AHM and the VE linearizers but not to the PAs to reduce the number of feedback loops. Also included is a radio system comprising a plurality of PAs; a Volterra DHM (VDHM) coupled to the PAs; a plurality of feedback loops corresponding to the PAs; and an AHM coupled to the PAs, wherein the feedback loops are connected to the AHM but not to the PAs to reduce the number of feedback loops.

20 Claims, 10 Drawing Sheets

U.S. PATENT DOCUMENTS

| | | | | |
|---|---|---|---|---|
| 7,629,902 B2 * | 12/2009 | Zhang et al. | | 341/106 |
| 7,729,445 B2 * | 6/2010 | Ravi et al. | | 375/297 |
| 7,937,106 B2 * | 5/2011 | Sorrells et al. | | 455/552.1 |
| 7,965,136 B2 * | 6/2011 | Rhodes et al. | | 330/2 |
| 2002/0027958 A1 * | 3/2002 | Kolanek | | 375/297 |
| 2006/0040624 A1 * | 2/2006 | Lipka | | 455/114.3 |
| 2008/0238544 A1 | 10/2008 | Morris et al. | | |
| 2010/0156528 A1 * | 6/2010 | Couchman et al. | | 330/124 R |

OTHER PUBLICATIONS

Provisional Application entitled "Adaptive Look-up Based Volterra-series Linearization of Signal Transmitters," by Peter Z. Rashev, et al., filed Apr. 4, 2006 as U.S. Appl. No. 60/788,970.

Patent Application entitled "Multi-Dimensional Volterra Series Transmitter Linearization," by John-Peter van Zelm, et al., filed Oct. 15, 2008 as U.S. Appl. No. 12/252,098.

* cited by examiner

MINIMUM FEEDBACK RADIO ARCHITECTURE WITH DIGITALLY CONFIGURABLE ADAPTIVE LINEARIZATION

CROSS-REFERENCE TO RELATED APPLICATIONS

Not Applicable.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates generally to signal amplification and linearization in radio transmitters and, more particularly, to a system and method for reducing required signal feedback.

BACKGROUND OF THE INVENTION

In wireless communications, signals are forwarded using radio transmission and receiving systems. Radio transmission systems may include power amplifiers (PAs), signal linearizers, such as a Volterra-series or Volterra Engine (VE) linearizers, which may be coupled to other system components such as antennas, and signal processing components. A digitally configurable radio (DCR), or agile radio, is a type of configurable radio transmission system that supports smart antenna operation modes, such as Multiple-Input and Multiple-Output (MIMO) or Single-Input and Single-Output (SISO), without hardware changes or upgrades, for instance using software or firmware. Accordingly, the agile radio can support different signal or beam related features, such as power combining, beam forming, sector power pooling, or combinations thereof.

SUMMARY OF THE INVENTION

In one embodiment, the disclosure includes a radio transmission system. The radio transmission system comprises a plurality of power amplifiers (PAs); a plurality of Volterra Engine (VE) linearizers corresponding to the PAs; a plurality of feedback loops corresponding to the PAs; at least one digital hybrid matrix (DHM) coupled to the VE linearizers; and an analog hybrid matrix (AHM) coupled to the PAs, wherein the feedback loops are connected to the AHM and the VE linearizers but not to the PAs to reduce the number of feedback loops.

In another embodiment, the disclosure includes a radio system. The radio system comprises a plurality of PAs; a Volterra DHM (VDHM) coupled to the PAs; a plurality of feedback loops corresponding to the PAs; and an AHM coupled to the PAs, wherein the feedback loops are connected to the AHM but not to the PAs to reduce the number of feedback loops.

In yet another embodiment, the disclosure includes a multi-port PA system. The multi-port PA system comprises a plurality of PAs; a Volterra DHM (VDHM) coupled to the PAs; a plurality of pre-processing blocks corresponding to the PAs; a single feedback loop corresponding to the PAs; and an AHM coupled to the PAs, wherein the feedback loop is connected to the AHM, the VDHM, and the pre-processing blocks.

Other aspects and features of the present invention will become apparent to those of ordinary skill in the radio communications art upon review of the following description of specific embodiments of the invention in conjunction with the accompanying figures.

DETAILED DESCRIPTION OF THE PREFERRED EMBODIMENTS

Figure 1:
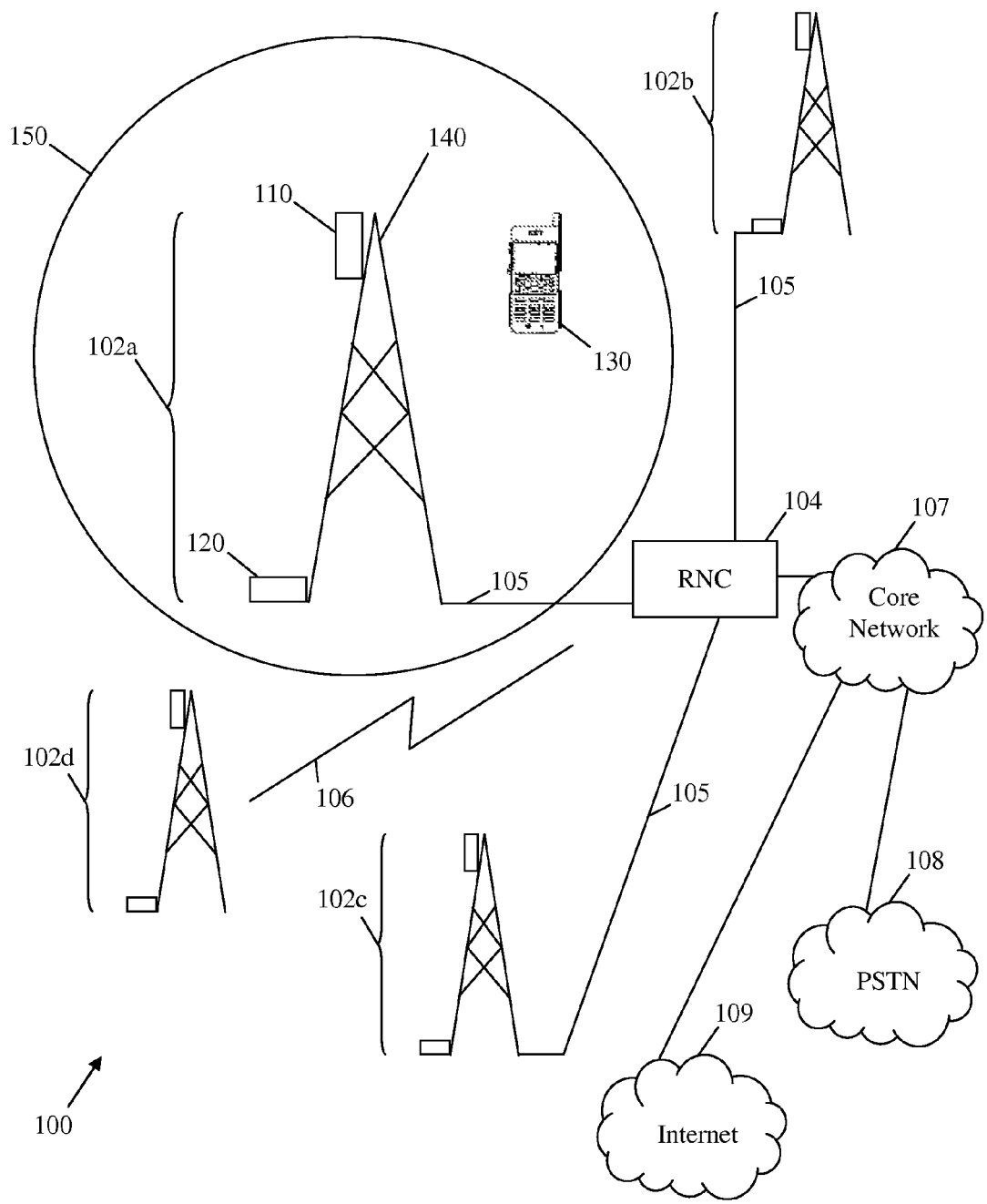
FIG. 1 is an illustration of an embodiment of a wireless communication system.

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

Signal or beam related features of DCRs or agile radios may be supported using a plurality of feedback signals associated with a plurality of power amplifiers. The feedback signals may be obtained from the power amplifiers using at least two feedback loops for each power amplifier. Each feedback loop may include a plurality of feedback components, such as feedback receivers, feedback circuitry, analog to digital converters, etc. Hence, each feedback component in the feedback loop may add to the cost and requirements of the system, such as hardware and software complexity and maintenance requirements. Further, the feedback components may increase nonlinear signal combining and cross talk between the different feedback loops, which increases errors or distortions in the transmitted signals and limits signal processing capacity.

Disclosed herein is a signal transmission system and method using a reduced number of feedback loops to decrease nonlinear signal combining and cross talk, increase signal processing capacity, and reduce system cost. In an embodiment, the system may comprise a first digital multiplexer coupled to a plurality of Volterra Engine (VE) linearizers, a plurality of power amplifiers (PAs) each coupled to a single VE linearizer, and an analog multiplexer coupled to the PAs. To provide feedback to the first digital multiplexer, the system may comprise a single feedback loop for each pair of VE linearizer and PA, which may be coupled to the analog multiplexer and the first digital multiplexer. Additionally, to provide feedback to the VE linearizers, the system may comprise a second digital multiplexer, which may be coupled to the single feedback loop and the VE linearizers. Alternatively, to provide feedback to the digital multiplexer and the VE linearizers, the system may comprise a single digital multiplexer, which may be coupled to the VE linearizers, the PAs, and the single feedback loop. In another embodiment, the system may comprise a combined digital multiplexer unit, including a plurality of VE linearizers, a plurality of PAs coupled to the combined digital multiplexer, an analog multiplexer coupled to the PAs. To provide feedback to the combined digital multiplexer and the VE linearizers within, the system may comprise a feedback loop associated with each PA, which may be coupled to the analog multiplexer and the combined digital multiplexer. Additionally or alternatively, the presented system architectures may comprise a plurality of multi-port PAs, where each multi-port PA may be associated with a pre-processing circuit or block and may comprise a plurality of PAs.

FIG. 1 illustrates one embodiment of a wireless communication system 100 in accordance with this disclosure. The wireless communication system 100 may be a cellular communications network, which may comprise a plurality of base transceiver stations (BTSs) 102a, 102b, 102c and 102d for providing wireless communications to a prescribed coverage area. Although, four BTSs are shown in the figure, the wireless communication system 100 may comprise any number of BTSs, which may be configured similarly or differently. Additionally, the wireless communication system 100 may comprise a Radio Network Controller (RNC) 104, which may be coupled to the BTSs 102a, 102b, 102c, and 102d by means of physical or wireless connections. For instance, the BTSs 102a, 102b, and 102c may be each coupled to the RNC 104 by a physical connection 105, while the BTS 102d may be coupled to the RNC 104 by a wireless connection 106. The wireless communication system 100 may also comprise a wireless communication device 130, which may be present or located within the prescribed coverage area of the wireless communication system 100. Although, only one wireless communication device 130 is shown in the figure, the wireless communication system 100 may also comprise any number of wireless communication devices 130, which may be configured similarly or differently. Accordingly, the RNC 104 may be configured to maintain or control wireless communications between the wireless communication device 130, and the BTSs 102a, 102b, 102c, 102d. Further, the RNC 104 may be coupled to a core network 107, which may include a mobile switchgear, a user validation, a gateway, or combinations thereof. In turn, the core network 107 may be coupled to other networks, such as a public switched telephone network (PSTN) 108, the Internet 109, at least one other wireless network (not shown), or combinations thereof.

The wireless communication device 130 may wirelessly communicate with any of the BTSs 102a, 102b, 102c, and 102d depending on its location or position within the prescribed coverage area. For instance, a wireless link established between the wireless communication device 130 and the BTS 102a, 102b, 102c, or 102d may be shifted or "handed off" to another BTS 102a, 102b, 102c, or 102d, when the mobile terminal 130 is moved or repositioned from a proximity of the BTS 102a, 102b, 102c, or 102d to the other BTS 102a, 102b, 102c, or 102d. Further, the wireless link may conform to any of a plurality of telecommunications standards or initiatives, such as those described in the 3rd Generation Partnership Project (3GPP), including Global System for Mobile communications (GSM), General Packet Radio Service (GPRS)/Enhanced Data rates for Global Evolution (EDGE), High Speed Packet Access (HSPA), Universal Mobile Telecommunications System (UMTS), and Long Term Evolution (LTE). Additionally or alternatively, the wireless link may conform to any of a plurality of standards described in the 3rd Generation Partnership Project 2 (3GPP2), including Interim Standard 95 (IS-95), Code Division Multiple Access (CDMA) 2000 standards 1xRTT or 1xEV-DO. The wireless link may also be compatible with other standards, such as those described by the Institute of Electrical and Electronics Engineers (IEEE), or other industry forums, such as the Worldwide Interoperability for Microwave Access (WiMAX) forum.

The BTS 102a, and similarly any of the BTSs 102b, 102c, and 102d, may comprise a DCR 110, a modem 120, and a communication tower 140. The DCR 110 and the modem 120 may each be coupled to the communication tower 140 and may communicate with one another. The DCR 110 may also communicate with the wireless communication device 130 over an area substantially covered by a signal range 150 corresponding to the BTS 102a. The DCR 110 and the wireless communication device 130 may communicate using a cellular technology standard, such as a Time Division Multiple Access (TDMA), CDMA, UMTS, or GSM. The DCR 110 and the wireless communication device 130 may communicate using other cellular standards, such as a WiMAX, LTE, or Ultra Mobile Broadband (UMB).

The DCR 110 may be an agile radio head, which may be reconfigured using software or firmware to extend or reduce the signal range 150, or to increase the capacity of the wireless communication system 100. For instance, the DCR 110 may be reconfigured using a software application to communicate with an additional number of wireless communication devices 130. The DCR 110 may comprise a plurality of transmitters, a plurality of receivers, or both to support at least one smart antenna operation mode, such as Multiple-Input and Multiple-Output (MIMO) or Single-Input and Single-Output (SISO). For instance, the DCR 110 may be reconfigured without hardware changes or upgrades to support signal features comprising power combining, beam forming, sector power pooling, or combinations thereof. Reconfiguring the DCR 110 without hardware changes may reduce reconfiguration or upgrade requirements or cost, such as eliminating or reducing the need for climbing the communication tower 140, renting or deploying infrastructure lifting or transfer equipments, or using additional hardware.

The wireless communication device 130 may be any device capable of transmitting or receiving a signal, such as an analog or digital signal, to and from a radio such as the DCR 110, using a wireless technology. The wireless communication device 130 may be a mobile device configured to create, send, or receive signals, such as a handset, a personal digital assistant (PDA), a cell phone (also referred to as a "mobile terminal"), or a wireless-enabled nomadic or roaming device, such as a laptop computer. Further, the wireless communication device 130 may be optionally configured to provide at least one data service, such as an e-mail service. Alternatively, the wireless communication device 130 may be a fixed device, such as a base transceiver station or a Femtocell, a desktop computer, or a set top box, which may send or receive data to the DCR 110.

The communication tower 140 may be any structure on which the DCR 110 may be mounted. In other embodiments of the wireless communication system 100, the communication tower 140 may be replaced by a building, other types of towers, e.g. water towers, or other structures suitable for mounting the DCR 110. Additionally, the communication tower 140 may connect the DCR 110 to the modem 120, and as such may provide communications between the two.

The DCR 110 may comprise a transmitter, such as a baseband transmitter configured to implement at least one cellular communications standard, such as CDMA, GSM, UMTS, or WiMAX. The transmitter may comprise a PA that amplifies a signal before transmission, in addition to a modulation subsystem, frequency translation subsystem, or combinations thereof. The PA may be coupled to at least one linearizer configured to compensate for at least some of the distortions introduced in the signal, e.g. nonlinearities in the PA. The linearizer may be a VE linearizer, such as a VE linearizer disclosed in U.S. Provisional Patent Application Ser. No. 60/788,970 filed Apr. 4, 2006 by Peter Z. Rashev, et al. and entitled "Adaptive Look-Up Based Volterra-series Linearization of Signal Transmitters," which is incorporated herein by reference as if reproduced in its entirety. The VE linearizer may be configured to approximate or implement at least one inverse signal model, using a plurality of Volterra series orders or terms, and hence to compensate for signal distortion. The inverse signal models may be implemented using software or firmware. For instance, the inverse signal models may be executed on a field-programmable gate array (FPGA), application specific integrated circuit (ASIC), digital signal processor, microprocessor, or other types of processors. The inverse signal models may be executed on a computer system, such as a personal computer, server, or other computer system.

Figure 2:
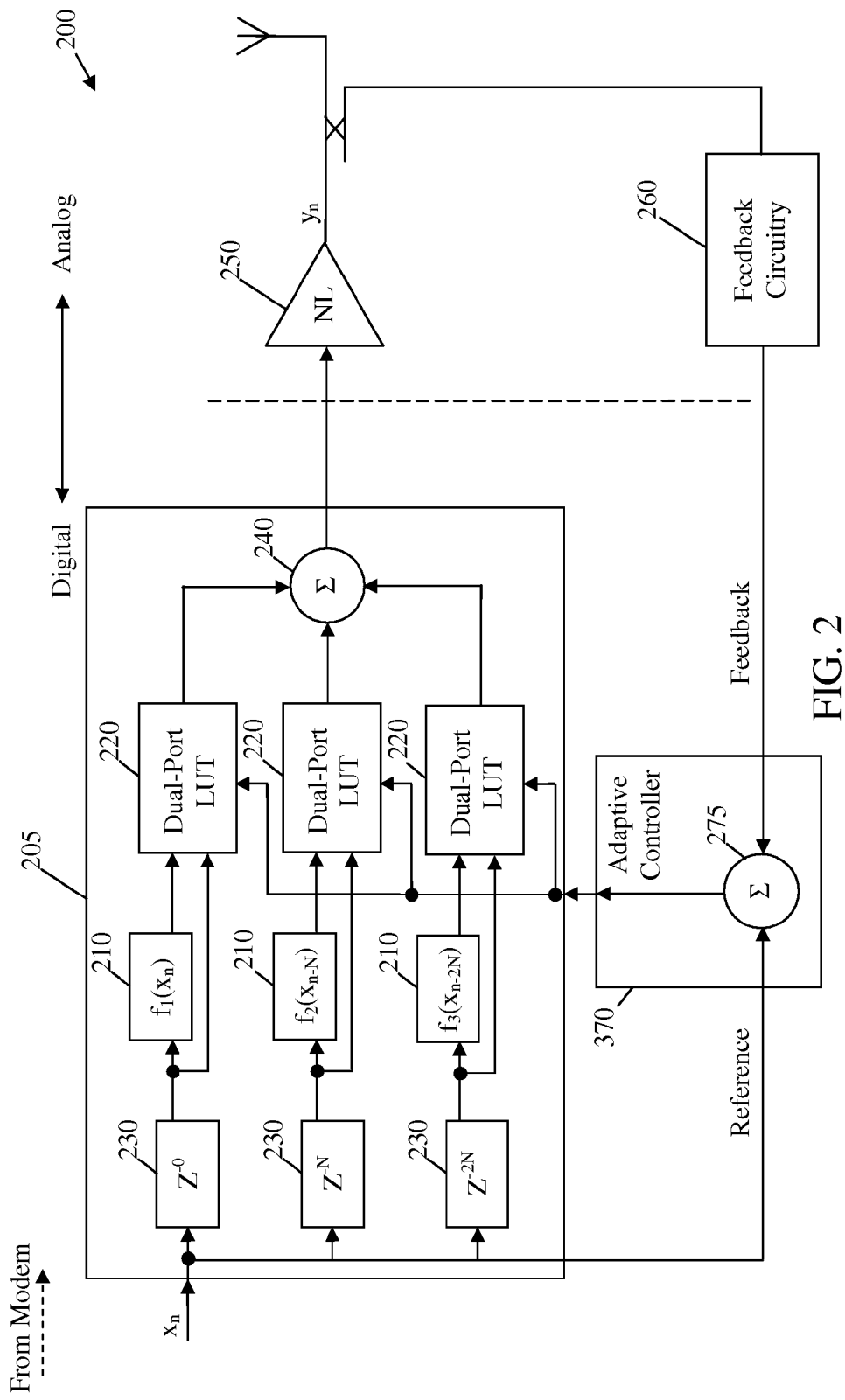
FIG. 2 is a block diagram of an embodiment of a VE based transmission system.

FIG. 2 illustrates an embodiment of a VE based transmission system 200, which may be used in radio transmission systems, such as the DCR 110. The VE linearizer 205 may comprise a plurality of multipliers 210, which may be coupled to a plurality of real and imaginary dual-port look-up table (LUT) pairs 220, encapsulated in a "dual-port LUT and multiplier" functional blocks. Accordingly, each multiplier may be coupled to a single "dual-port LUT and multiplier" functional block. Additionally, each multiplier 210 may be coupled to a tap-delay line 230. The tap-delay lines 230 may comprise a plurality of delay elements, which may be spaced by a spacing of N samples. Specifically, each delay element ($Z^{-n}$) may designate a propagation delay of n discrete samples, where n is a discrete time index. Each "dual-port LUT and multiplier" functional block 220 may be coupled to one of the tap-delay lines 230 via a multiplier implementing a functional mapping $f_i$ (i=1, 2, 3 . . . ), such as approximating or calculating an input signal or sample delay. The tap-delay line 230 may change a function of a present input sample based on future samples. Hence, the tap-delay elements may form a time axis for the Volterra series, which may comprise a history of the evolution of a waveform, such as a plurality of polynomial functions across time. The outputs of the multipliers 220 and the "dual-port LUT and multiplier" functional block 220 may be added together using a summation block 240 to provide a pre-distorted version of the digital input sample ($x_n$). The pre-distortion digital input sample may then be converted to an analog signal, which may be equivalent to the pre-distortion input signal, using a digital-to-analog converter (DAC) (not shown in the figure). The analog signal may be sent to the amplifier 250, which may be a nonlinear (NL) power amplifier (PA). The analog signal may be up converted to a radio frequency either before inputting to the amplifier 250. The amplifier 250 may amplify and transmit the amplified analog signal ($y_n$), for instance using an antenna. The DAC may be coupled to the VE linearizer 205 or the amplifier 250.

Further, a digital feedback signal, which may be a digitized copy of the analog output or transmitted signal, may be provided to the VE linearizer 205 using an analog-to-digital converter (ADC). Specifically, the amplifier 250 may be coupled to a feedback circuitry 260 comprising a feedback receiver and any additional component, such as the ADC, configured to forward the digital feedback signal to an adaptive controller 270, which may be coupled to the VE linearizer 205 and the feedback circuitry 260. The analog output of the amplifier 250 may be down converted from radio frequency to an intermediate frequency or to a baseband frequency before processing by the ADC and/or by the feedback circuitry 260. The adaptive controller 270 may be coupled to or comprise an error block 275, which may receive the feedback signal from the feedback circuitry 260, in addition to a copy of the digital input signal of the VE linearizer 205 or a reference signal. In some embodiments, the error block 275 may be coupled to a propagation delay compensation block (not shown in the figure), which compensates for any delay in the feedback signal before forwarding the reference signal to the error block 275 at the adaptive controller 270. Hence, the error block 275 may use the digital feedback signal and the reference signal to obtain or calculate an error function, which may then be forwarded to the VE linearizer 205 and used to obtain the inverse signal processing model for pre-distortion compensation. Additionally or alternatively, the adaptive controller 270 may comprise at least one signal processing circuitry, which uses the feedback and reference signals to obtain a correction function, which may be forwarded to the VE linearizer 205 and used to obtain the inverse model.

Figure 3:
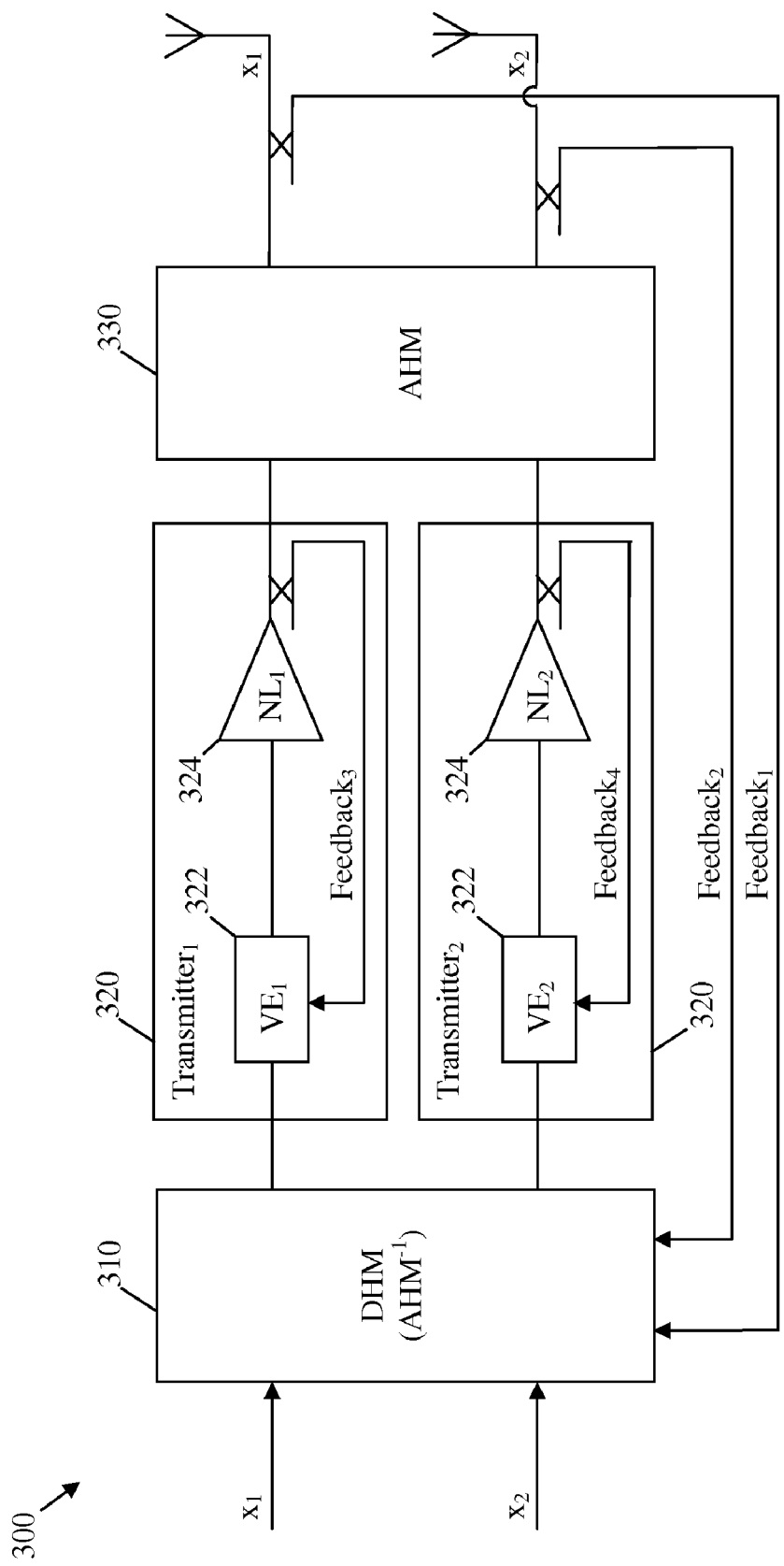
FIG. 3 is a block diagram of an embodiment of a VE based DCR system.

FIG. 3 illustrates an embodiment of a VE based DCR system 300, which may be used to transmit signals in wireless communication systems, such as the wireless communication system 100. The VE based DCR system 300 may comprise a digital hybrid multiplexer (DHM) 310, at least one transmitter 320, and an analog hybrid multiplexer (AHM) 330. The transmitter 320 may be coupled to the DHM 310 and the AHM 330. Additionally, the DHM 310 and the AHM 330 may be coupled to one another. Although, two transmitters 320 are shown in the figure, the VE based DCR system 300 may comprise any number of transmitters 320.

The transmitter 320 may comprise a VE linearizer 322 coupled to a nonlinear (NL) PA 324, which may be configured similar to the VE linearizer 205 and the amplifier 250, respectively. In some embodiments, the VE linearizer 322 may be a combined VE linearizer, such as a VE linearizer disclosed in U.S. patent application Ser. No. 12/252,098 filed on Oct. 15, 2008, published as U.S. Publication of Application No. US 2010/0093290A1, by John-Peter van Zelm, et al. and entitled "Multi-Dimensional Volterra Series Transmitter Linearization," which is incorporated herein by reference as if reproduced in its entirety. As such, the VE linearizer 322 may comprise a plurality of integrated VE linearizers, which may be arranged in series, in parallel, or both to improve signal distortion compensation in the system. The VE linearizer 322 may forward a combined digital input signal to the corresponding NL PA 324 and may receive, via a feedback loop, a feedback signal equivalent to an amplified analog output signal from the NL PA 324. Accordingly, the VE based DCR system 300 may comprise signal conversion circuitry (not shown in the figure), such as an ADC, DAC, or both, which may be coupled to the VE linearizer 322, the NL PA 324, or both. The feedback loop may comprise a feedback circuitry and an adaptive controller coupled to the feedback circuitry.

The feedback circuitry may be coupled to the NL PA 324 and may provide a feedback signal from the NL PA 324 to the adaptive controller. The adaptive controller may be coupled to the VE linearizer 322, and may receive a reference signal equivalent to the input signal of the VE linearizer 322 and provide the VE linearizer 322 with a correction or error function. As such, the number of feedback loops between the VE linearizer 322 and the NL PA 324, or VE feedback loop, maybe equal to the number of transmitters 320.

The DHM 310 may be configured to receive a plurality of digital signals, for instance from a modem, at a plurality of separate input ports, and divide each digital input signal into a plurality of component signals, which may be substantially similar too one another or to the digital input signal. The DHM 310 may distribute the component signals for each digital input signal over a plurality of separate output ports, where each component signal may be mapped to one output port. As such, each output port may be assigned a plurality of component signals, each corresponding to a separate digital input signal. The DHM 310 may combine the component signals at each output port into a combined signal, for instance by summing the component signals. Hence, the DHM 310 may forward a substantially similar combined signal from each output port. In an embodiment, the DHM 310 may be a multiplexer or an N×N coupler, where N is an integer representing the number of digital input signals that may be combined. For instance, the DHM 310 may receive N digital input signals, divide each digital input signal into N component signals, combine N component signals from N digital input signals into N combined signals, and forward the N combined signals. For example, in the case where the DHM 310 receives two digital input signals ($x_1$, $x_2$), the DHM 310 may forward two combined signals to the transmitter 320, as shown in the figure.

On the other hand, the AHM 330 may be configured to receive a plurality of analog output signals which may be amplified, from a transmitter 320, at a plurality of input ports. The amplified analog output signals may be equivalent to amplified versions of the combined signals from the DHM 310. The AHM 330 may divide each analog output signal into a plurality of component signals, which may be equivalent to the inverse of the distributed component signals at the DHM 310. The AHM 330 may distribute and combine the component signals over a plurality of output ports, similar to the DHM 310, to obtain a plurality of combined signals. The combined signals at the AHM 330 may be equivalent to the digital input signals of the DHM 310. Accordingly, the AHM 330 may be configured to implement an inverse process, of distributing and combining signals, of the DHM 310. For instance, the DHM 310 may act as a signal multiplexer or coupler, while the AHM 330 may act as the corresponding signal de-multiplexer or de-coupler. However, unlike the DHM 310 that may be configured to process digital input signals, the AHM 330 may be configured to process analog output signals, which may also be amplified and transmitted signals, for instance using an antenna coupled to the AHM 330. In an embodiment, the DHM 310 and the AHM 330 may be hybrid matrix modules, such as the hybrid matrix modules disclosed in U.S. Pat. No. 7,206,355 issued Apr. 17, 2007 by Neil N. McGowan, et al. and entitled "Digitally Convertible Radio," which is incorporated herein by reference as if reproduced in its entirety.

Using the DHM 310 and the AHM 330, the VE based DCR system 300 may amplify each input signal partially, and hence amplify each output signal sufficiently for transmission. Specifically, each NL PA 324 may amplify one combined signal from the DHM 310, which may be substantially similar or a copy of the remaining combined signals associated with the remaining NL PAs 324. When one transmitter 320 or one NL PA 324 fails, the remaining combined signals from the DHM 310 may be amplified by the remaining NL PAs 324. The remaining amplified signals may then be received and converted or transformed into output signals, which may be sufficiently amplified when the number of failed NL PAs 324, and hence the missing signal power or strength due to the missing combined signals, remains tolerable. Additionally, the output signals may be substantially equivalent to the input signals, and comprise tolerable distortions or signal degradations due to the missing combined signals. Further, amplifying the combined signals using different NL PAs, may allow power sharing of the input signals among the NL PAs 324, where each combined signal includes different component signals from different input signals. As such, additional signal power may be obtained by combining the outputs of two or more NL PAs 324. Consequently, the VE based DCR system 300 may comprise lower cost NL PAs 324 with reduced power or maximum load requirements.

The DHM 310 and the AHM 330 may be coupled to one another, via a feedback loop associated with each transmitter 320. Accordingly, the AHM 330 may forward a plurality of feedback signals, each equivalent to a transmitted signal at a transmitter 320, to the DHM 310 via a plurality of separate feedback loops. The DHM 310 may use each feedback signal, which may also be associated with one digital input signal, to compensate for signal errors or distortions prior to distributing and combining the digital input signals. The number of feedback loops between the AHM 330 and the DHM 310, or DCR feedback loop, maybe equal to the number of transmitters 320. Hence, the total number of feedback loops in the VE based DCR system 300 may be about equal to twice the number of VE linearizers 322 or NL PAs 324, which is equal to the sum of the number of VE feedback loops and the number of DCR feedback loops.

Figure 4:
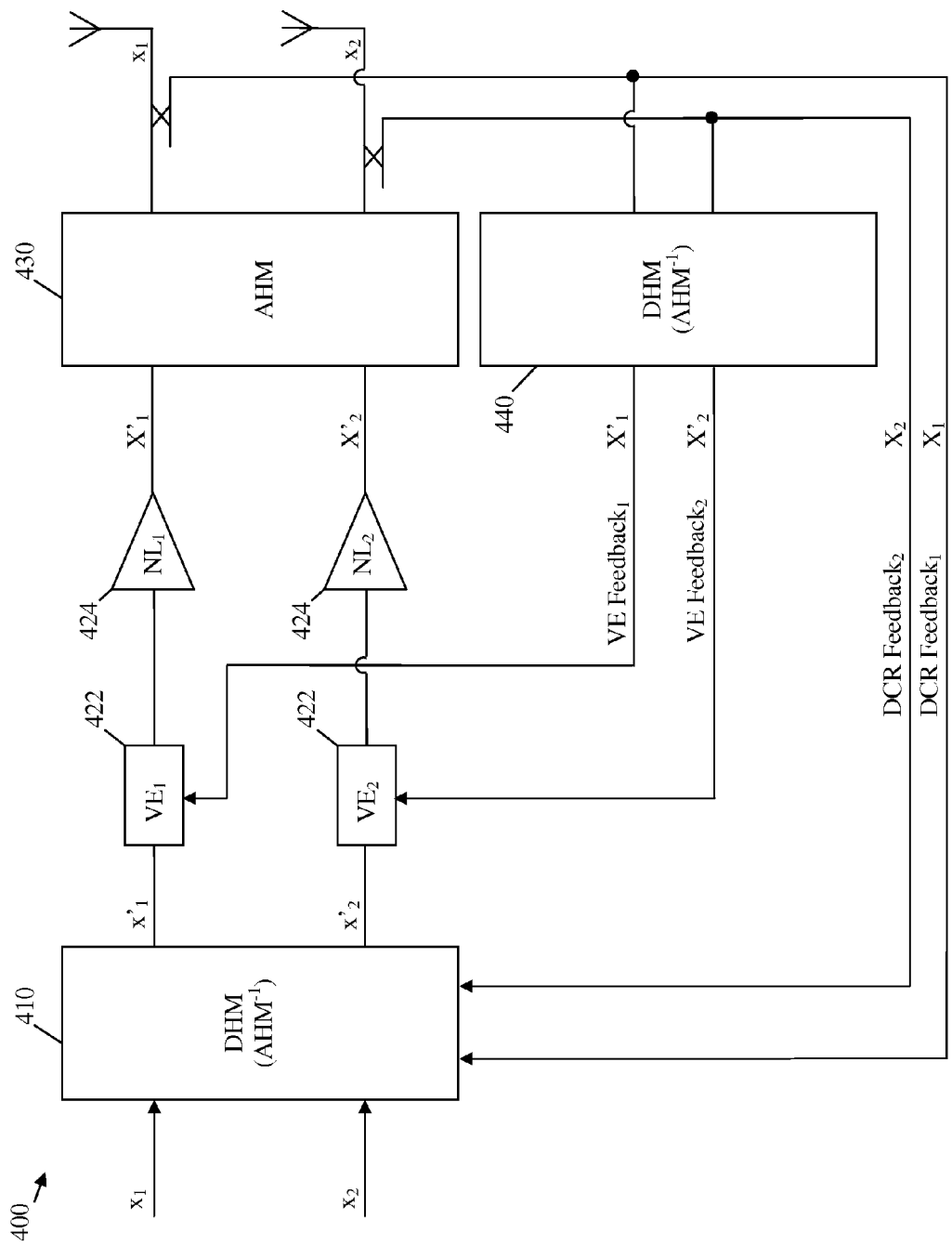
FIG. 4 is a block diagram of an embodiment of a reduced feedback DCR system.

FIG. 4 illustrates an embodiment of a of a reduced feedback DCR system 400 comprising fewer feedback loops than more conventional DCR systems, such as the VE based DCR system 300, and may be associated with about the same number of transmitters. Consequently, the reduced feedback DCR system 400 may have higher signal processing capacity with less nonlinear signal combining and cross talk, which may be introduced by a reduced number of feedback components, e.g. feedback circuitry and adaptive controllers. Additionally, due to the reduced number of feedback components, the cost of the reduced feedback DCR system 400 may be lower than the cost of the more conventional DCR systems.

The reduced feedback DCR system 400 may comprise a first DHM 410, at least one pair of transmitter components comprising a VE linearizer 422 and a corresponding NL PA 424, and an AHM 430, which may be configured similar to the corresponding components of the VE based DCR system 300. However, the reduced feedback DCR system 400 may comprise no VE feedback loops, i.e. no feedback loops between the VE linearizer 422 and the NL PA 424. Instead, the reduced feedback DCR system 400 may comprise a second DHM 440 coupled to each VE linearizer 422 and each corresponding DCR feedback loop between the AHM 430 and the first DHM 410.

Specifically, the second DHM 440 may receive a copy of a feedback signal from each DCR feedback loop coupled to the AHM 430, and corresponding to a pair of VE linearizer 422 and NL PA 424. The feedback signal may be converted from analog waveform to digital waveform, for instance using an ADC or a feedback circuitry, which may be coupled to the DCR feedback loop. Hence, the second DHM 440 may receive the feedback signal in digital form. The second DHM 440 may be configured similar to the first DHM 410, and may distribute and combine the feedback signals corresponding to each VE linearizer 422 and NL PA 424 pair into a plurality of combined feedback signals ($X'_1$, $X'_2$). Hence, the second DHM 440 may send each combined feedback signal to a corresponding VE linearizer 422. Additionally, each VE linearizer 422 may receive a combined input signal ($x'_1$, $x'_2$) from the first DHM 410. The VE linearizer 422 may use the combined feedback signal to correct or adjust for errors or distortions in the corresponding combined input signal, and hence forward a corrected signal to the NL PA 424.

Using the second DHM 440 in the reduced feedback DCR system 400 may replace the need for using a number of VE feedback loops about equal to the number of VE linearizers 422 in the system. As such, adding one single component, i.e. the second DHM 440, in the reduced feedback DCR system 400 may be an advantageous compromise, which eliminates the need for using a greater number of components, including feedback circuitry, adaptive controllers, or other components associated with the feedback loops. The total number of feedback loops in the system is reduced to the number of DCR feedback loops, and therefore by about half in comparison to other DCR systems, such as the VE based DCR system 300.

Figure 5:
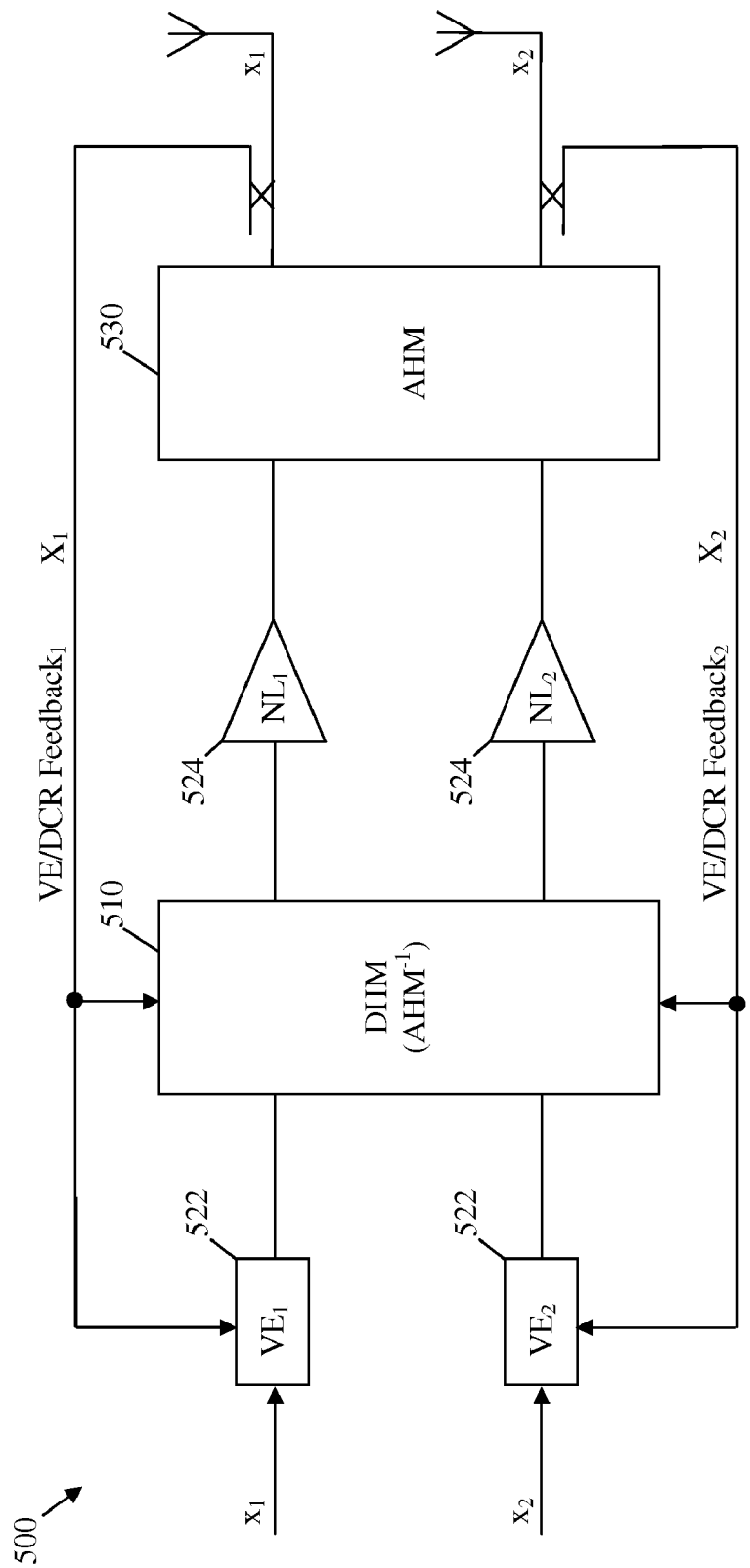
FIG. 5 is a block diagram of another embodiment of a reduced feedback DCR system.

FIG. 5 illustrates an embodiment of another reduced feedback DCR system 500, which may comprise a reduced number of feedback loops in comparison to other DCR systems, without using additional components. The reduced feedback DCR system 500 may comprise a DHM 510, at least one pair of transmitter components comprising a VE linearizer 522 and a corresponding NL PA 524, and an AHM 530, which may be configured similar to the corresponding components of the VE based DCR system 300 or the reduced feedback DCR system 500. Similar to the reduced feedback DCR system 400, the reduced feedback DCR system 500 may comprise a plurality of DCR feedback loops, each associated with a pair of VE linearizer 522 and NL PA 524, and no VE feedback loops. As such, the total number of feedback loops may be about equal to the number of VE linearizer 522 or NL PA 524.

However, unlike the reduced feedback DCR system 400, the reduced feedback DCR system 500 may comprise substantially no additional components in comparison to other conventional DCR systems. For instance, the reduced feedback DCR system 500 may not comprise a second DHM, such as the second DHM 440 of the reduced feedback DCR system 400. Instead, the components of the reduced feedback DCR system 500 may be rearranged to provide feedback signals to the VE linearizers 522 and the DHM 510. Accordingly, the DHM 510 may be coupled to the VE linearizers 522 and the NL PAs 524, which may be in turn coupled to the AHM 530. Each VE linearizer may receive an input digital signal ($x_1$, $x_2$), for instance from a modem, and forward the signal to the DHM 510. Hence, the DHM 510 may distribute and combine the received signals from the VE linearizers 522, and forward the combined signals to the NL PA 524. The forwarded combined signals may be digital signals, which may be converted to analog signals before being received by the NL PA 524, as described above. The NL PAs 524 may amplify and send the signals to the AHM 530, which convert the signals into output signals equivalent to the input signals and transmit the out output signals.

The AHM 530 may be coupled to each VE linearizer 522 via a DCR feedback loop to provide the VE linearizers 522 with the corresponding feedback signals. The DCR feedback loops may comprise an ADC or similar component (not shown in the figure) to convert the analog signals at the AHM 530 to digital signals, which may be processed by the VE linearizers 530. Additionally, the DCR feedback loops may be coupled to the DHM 510, and may thus provide the DHM 510 with corresponding feedback signals. Accordingly, the AHM 530 may be directly coupled to the VE linearizers 522, via the DCR feedback loops, and without an intermediary component, such as the DHM 310 in the case of the VE based DCR system 300 or the second DHM 440 in the reduced feedback DCR system 400. Therefore, the VE linearizers 522 may be configured to compensate for nonlinear effects or distortions, which may be introduced to the feedback signals by the AHM 530. Hence, such arrangement of components or DCR architecture may offer improved signal linearization and quality, in addition to the benefits of reduced feedback loops.

Figure 6:
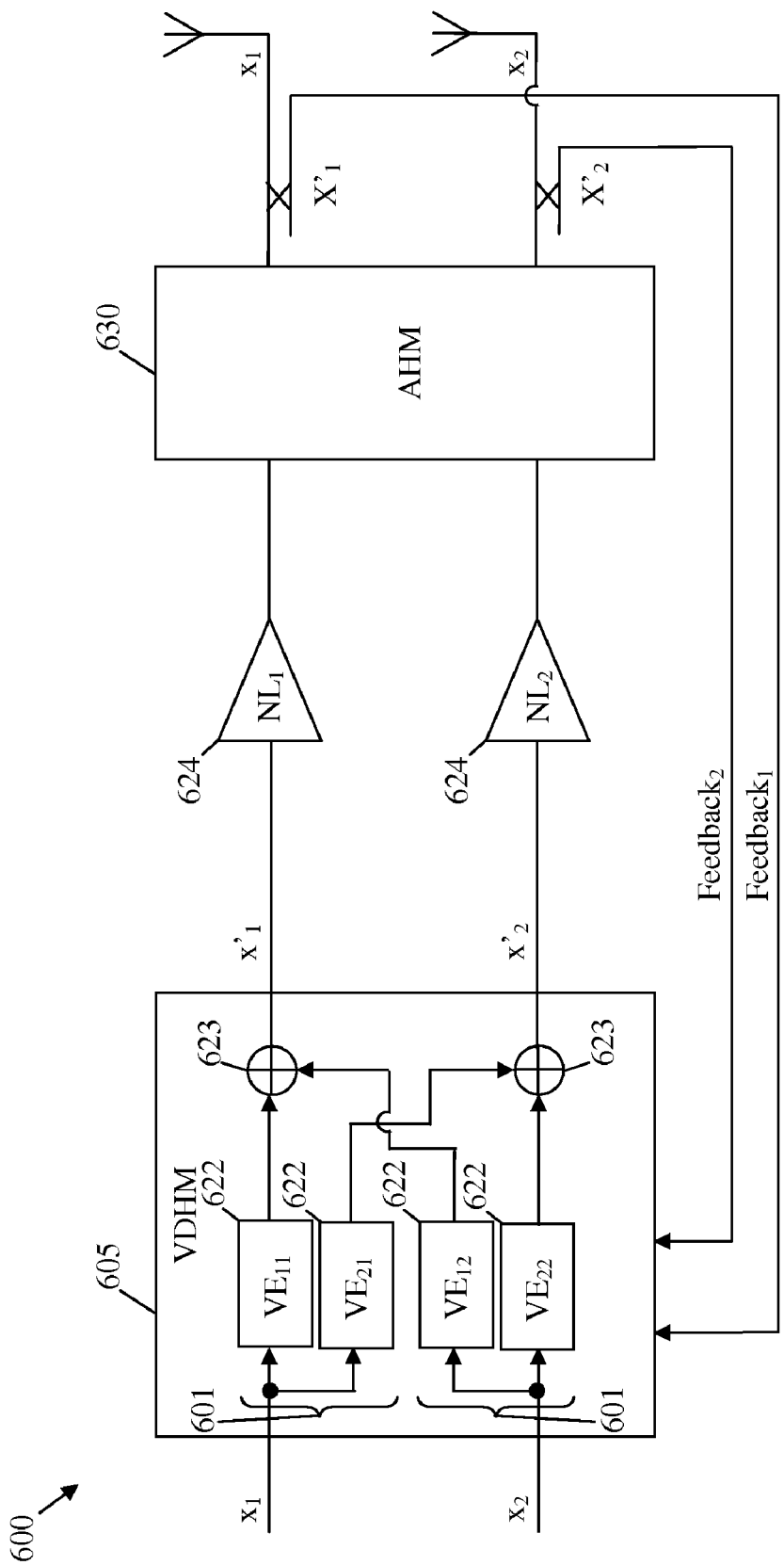
FIG. 6 is a block diagram of another embodiment of a VDHM based DCR system.

FIG. 6 illustrates an embodiment of a Volterra DHM (VDHM) based DCR system 600, which may comprise an integrated VE based DHM in addition to a reduced number of feedback loops. The VDHM based DCR system 600 may comprise a Volterra DHM (VDHM) 605, at least one NL PA 624 coupled to the VDHM 605, and an AHM 630 coupled to the NL PA 624. Additionally, the AHM 630 may be coupled to the VDHM 605 by at least one feedback loop, such that each feedback loop may correspond to one NL PA 624. Hence, the total number of feedback loops in the VDHM based DCR system 600 may be about equal to the number of NL PAs 624. For example, the VDHM based DCR system 600 may comprise two NL PAs 624 and two feedback loops, as shown in FIG. 6.

The VDHM 605 may comprise a plurality of sets of VE linearizers 601 and a plurality of couplers 623, which may be each coupled to the sets of VE linearizers 601. The sets of VE linearizers 601 may be each associated with one NL PA 624 and coupled to one corresponding feedback loop. Each set of VE linearizers 601 may comprise at least one VE linearizer 622. For example, each set of VE linearizers 601 may comprise two VE linearizers 622, and hence the total number of VE linearizers 622 in the VDHM 605 may be about twice that of the NL PAs 624 or twice that of the feedback loops. Each set of VE linearizers 601 may receive a different input signal. Each VE linearizer 622 in the set of VE linearizers 601 may receive a substantially similar copy of the input signal, process the signal, and send a substantially similar or different processed signal to a different coupler 623. The coupler 623 may be configured to combine the signals received from one VE linearizer 622 in each set of VE linearizers 601, e.g. $VE_{11}$ and $VE_{12}$, or $VE_{21}$ and $VE_{22}$, which may be substantially similar or different signals. The coupler 623 may then forward the combined signal ($x'_1$, $x'_2$) to the corresponding NL PA 624, which may hence be converted from digital waveform to analog waveform.

In turn, the NL PA 624 may forward an amplified analog version of the received signal to the AHM 630. The AHM 630 may receive the analog signals, process the signals, as described above, and transmit a plurality of output analog and amplified signals equivalent to the corresponding input digital signals. Additionally, the AHM 630 may forward a plurality of corresponding feedback signals to the VDHM 605. In an embodiment, each set of VE linearizers 601 may be couple to one feedback loop, and may hence receive one corresponding feedback signal. Each VE linearizer 622 in the set of VE linearizers 601 may receive a copy of the corresponding feedback signal and hence use the feedback signal to compensate for signal distortions or linearize the signal.

Since the VDHM 605 may be used to implement both signal linearization and signal distribution and combining, the VDHM 605 may replace the function of a plurality of separate VE linearizers and a DHM. Similar to the reduced feedback DCR system 500, the VDHM 605 may be directly coupled to the AHM 630, and hence the individual VE linearizers 622 of the VDHM 605 may be configured to compensate for nonlinear or undesired signal effects introduced by the AHM 630. In addition to reducing the number of feedback loops in the system, using the VDHM 605 may also be advantageous to further reduce cross talk by substituting parallel arrangements of components, and hence improving system robustness. Finally, the VDHM 605 may allow resource sharing among a plurality of components, e.g. VE linearizers 622 and couplers 623, which increases system efficiency.

Figure 7:
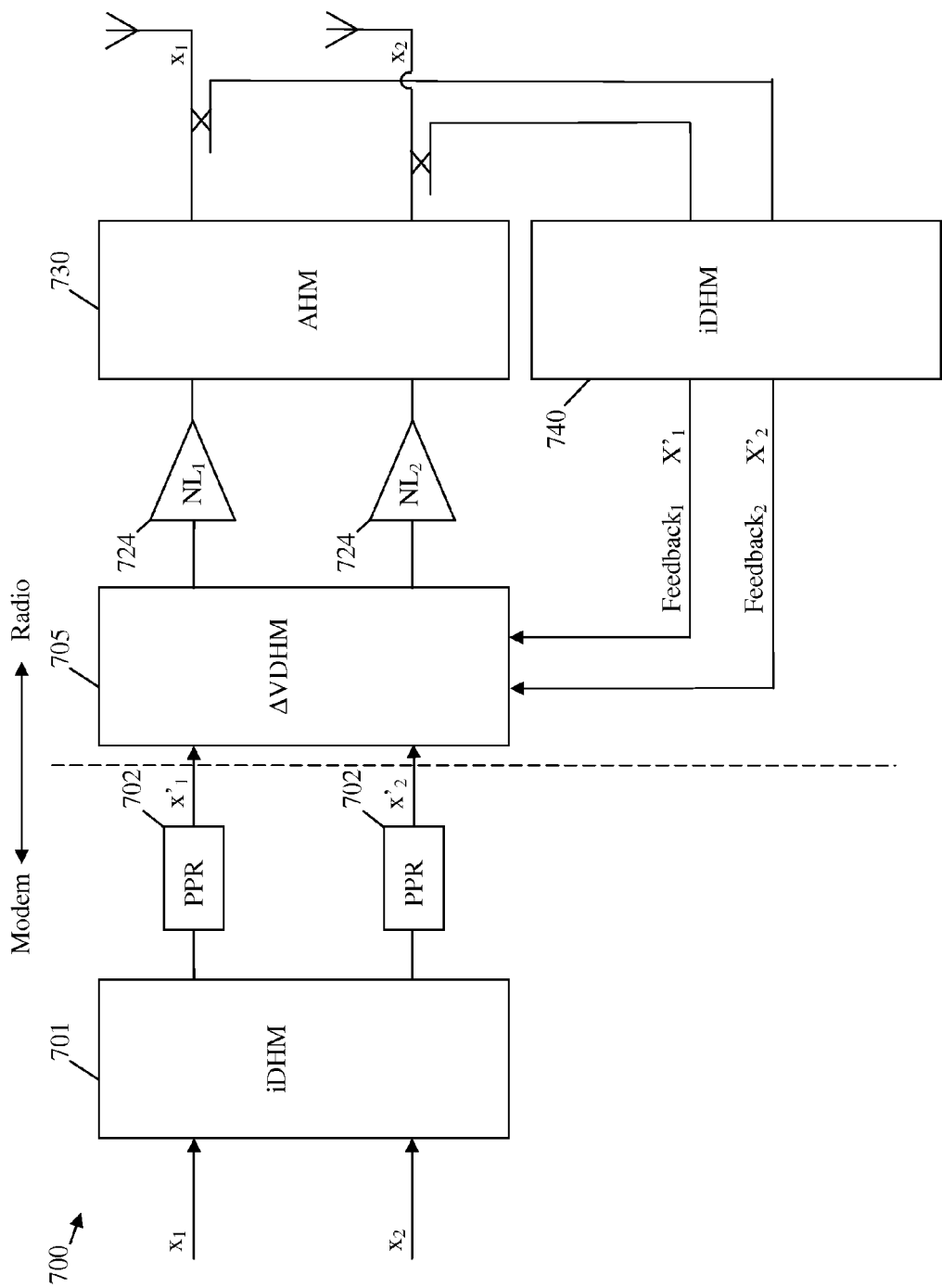
FIG. 7 is a block diagram of an embodiment of a Peak Power Reduction (PPR) based DCR system.

FIG. 7 illustrates an embodiment of a peak power reduction (PPR) based DCR system 700, which may use a VDHM component in PPR base systems. The PPR based DCR system 700 may be used in wireless or radio systems with stringent signal requirements or low signal degradation tolerance, such as Orthogonal Frequency-Division Multiplexing (OFDM) based 4G systems. In such systems, PPR techniques may be applied at the modem and before signal power amplification to reduce undesired effects introduced by the DHM components in the radio. Specifically, the PPR techniques may be applied to reduce or limit signal peak to average ratios (PARs), which may be further increased due to signal processing at the DHM components.

The PPR based DCR system 700 may comprise modem components, including a first ideal DHM (iDHM) 701 and at least one PPR block 702 coupled to the first iDHM 710. Additionally, the PPR based DCR system 700 may comprise radio components including a delta VDHM (ΔVDHM) 705 coupled to the PPR block 702, at least one NL PA 724 coupled to the ΔVDHM 705, an AHM 730 coupled to the NL PA 724, and a second iDHM 740. The second IDHM 740 may be coupled, via at least one feedback loop, to the AHM 730 and the ΔVDHM 705.

The first iDHM 701 may be configured to distribute and combine the input signals, similar to the DHM 410 and the DHM 510. However, unlike the DHM components above, the first iDHM 701 may process the signals in a fixed manner and may not be reconfigurable. The first iDHM 701 may be pre-configured to process the input signals based on ideal system response conditions and without receiving or using feedback signals. For instance, the first iDHM 701 may be configured in a predetermined manner based on an ideal AHM response or feedback signal. Hence, the first iDHM 701 may forward each combined signal to a PPR block 702, which may in turn implement at least one PPR technique to control or reduce the signal power before forwarding the signal to the ΔVDHM 705 in the radio.

The ΔVDHM 705 may be configured to distribute and combine the input signals, in an adaptive manner, similar to the DHM 410 and the DHM 510. However, the ΔVDHM 705 may process the signals based on the difference between predefined ideal and real system responses and not entirely on real system responses. Accordingly, the ΔVDHM 705 may process the signals to compensate from any deviations introduced by the AHM 730 from its ideal or expected responses. The ΔVDHM 705 may use the feedback signals, which may be forwarded from the second iDHM 740 via the feedback loops, to process the corresponding input signals. The second iDHM 740 may be configured similar to the first iDHM 701, and may be used in an arrangement similar to the DHM 440 described above to substitute for using additional VE feedback loops.

In addition to the compatibility of the PPR based DCR system 700 with stringent signal PAR requirements, the ΔVDHM 705 may add similar advantages as the VDHM 605, including reducing the number of feedback loops to about the number of NL PAs 724, compensating for nonlinear effects of the AHM 730, and reducing cross talk.

Figure 8:
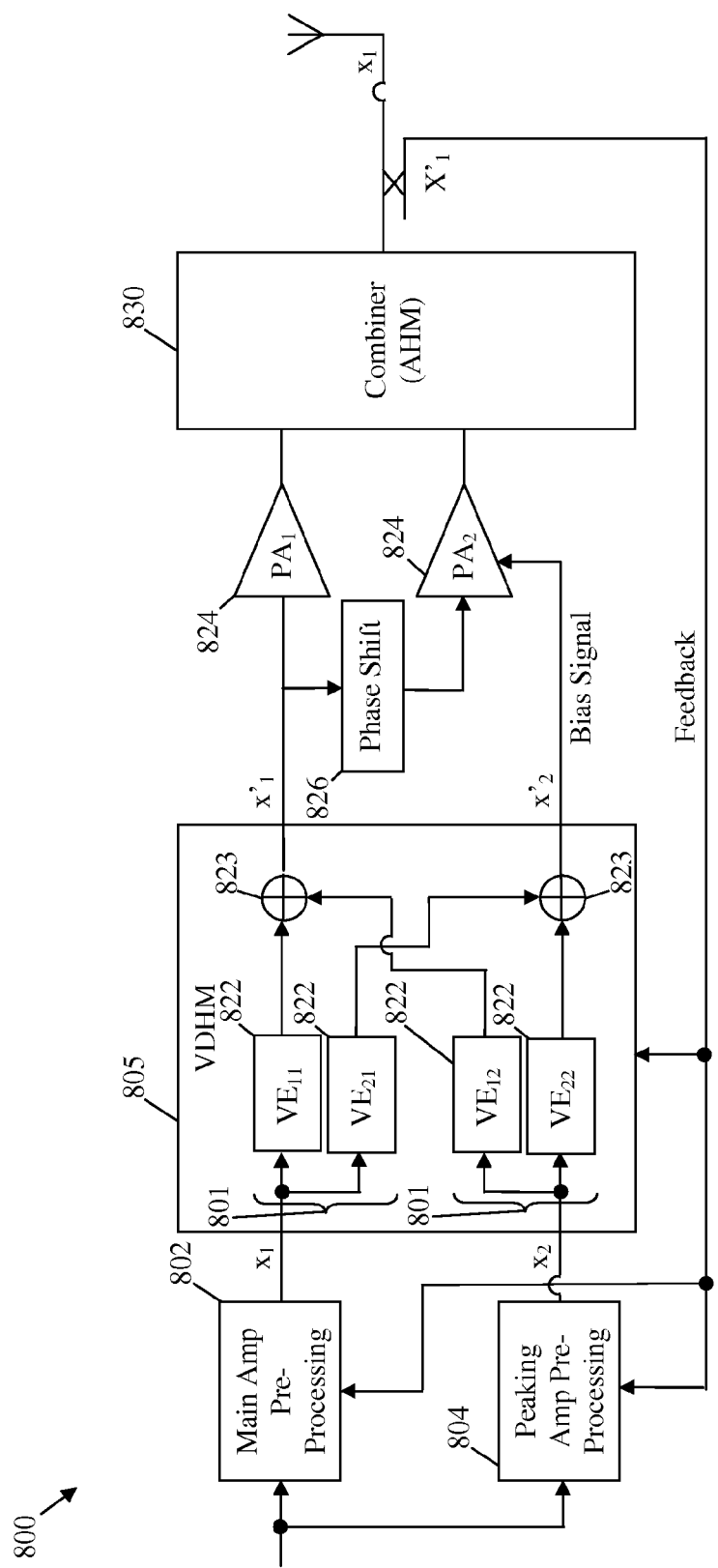
FIG. 8 is a block diagram of an embodiment of a multi-port PA DCR system.

FIG. 8 illustrates an embodiment of a multi-port PA DCR system 800, which may use a VDHM component and a reduced number of feedback loops. The multi-port PA DCR system 800 may comprise a VDHM 805, at least one multi-port PA 824 coupled to the VDHM 805, and an AHM 830 coupled to the multi-port PA 824, which may be configured similar to their corresponding components described above. Additionally, the multi-port PA DCR system 800 may comprise a plurality of pre-processing blocks, each associated with a multi-port PA 824, and a phase shift block 626. Each of the pre-processing blocks may be configured to implement synchronization, phase alignment, mapping functions, other signal processing functions, or combinations thereof.

In an embodiment, the multi-port PA DCR system 800 may comprise two multi-port PAs 824 and two pre-processing blocks, a main amplifier pre-processing block 802, corresponding to a first multi-port PA 824 ($PA_1$), and a peaking amplifier pre-processing block 804, corresponding to a second multi-port PA 824 ($PA_2$), as shown in the figure. Further, the two multi-port PAs 824 may comprise a plurality of PAs, which may be configured similar to the NL PAs described above. Alternatively, at least some of the multi-port PAs 824 may be advanced PAs, such as Doherty or Asymmetrical Doherty amplifiers. Each multi-port PA 824 may be coupled to the AHM 830 and the VDHM 805. Specifically, the first multi-port PA 824 ($PA_1$) may be coupled to one coupler 823 to receive a combined signal from two VE linearizers 822, e.g. $VE_{11}$ and $VE_{12}$, which may be coupled to the AHM 830, via the feedback loop. On the other hand, the second multi-port PA 824 ($PA_2$) may receive a phase shifted signal with respect to the combined signal of the first multi-port PA 824 ($PA_1$). The phase shifted signal may be received by the second multi-port PA 824 ($PA_2$) via the phase shift block 626, which may be connected to the input of the first multi-port PA 824 ($PA_1$). The second multi-port PA 824 ($PA_2$) may also be coupled to another coupler 823 to receive a bias signal from two other VE linearizers 822, e.g. $VE_{21}$ and $VE_{22}$. The AHM 830 may receive the output signals from the first multi-port PA 824 ($PA_1$) and the second multi-port PA 824 ($PA_2$), combine the signals into a single output signal, and transmit the signal, for instance using an antenna. The AHM 830 may also be coupled to the VDHM 805, the main amplifier pre-processing block 802, and the peaking amplifier pre-processing block 804, via the single feedback loop, and may forward a feedback signal corresponding to the two multi-port PAs 824 accordingly.

In other embodiments, the multi-port PA DCR system 800 may comprise any number of multi-port PAs 824 and a corresponding number of pre-processing blocks and phase shift blocks 626. Accordingly, at least some pairs of multi-port PAs 824 may be connected via a phase shift block 626 and linked or coupled to two pre-processing blocks and a single feedback loop, as described above. Hence, the total number of feedback loops in the multi-port PA DCR system 800 may be about equal to half the number of multi-port PAs 824.

Figure 9:
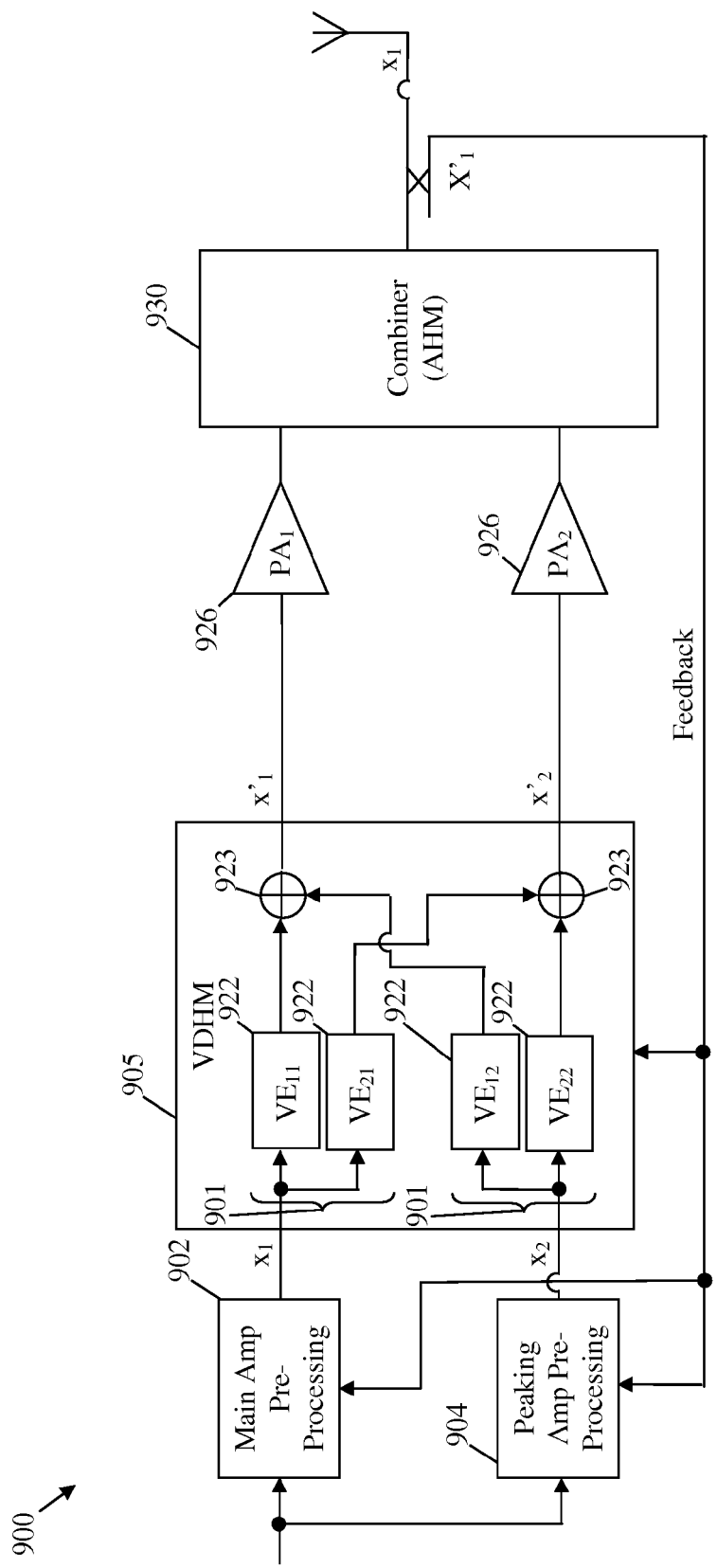
FIG. 9 is a block diagram of another embodiment of a multi-port PA DCR system.

FIG. 9 illustrates an embodiment of another multi-port PA DCR system 900, which may be configured similar to the multi-port PA DCR system 800. As such, the multi-port PA DCR system 900 may comprise a VDHM 905, at least one multi-port PA 924 coupled to the VDHM 905, and an AHM 930 coupled to the multi-port PA 924. The multi-port PA DCR system 900 may also comprise a plurality of pre-processing blocks, for instance a main amplifier pre-processing block 902 and a peaking amplifier pre-processing block 904, coupled to the VDHM 905 and the AHM 930, via a feedback loop.

However, unlike the multi-port PA DCR system 800, the multi-port PA DCR system 900 may not comprise a phase shift block connected or coupled to the multi-port PAs 924. Instead, each multi-port PA 924 may be coupled to a coupler 923 to receive a combined signal from a plurality of VE linearizer 922 at different sets of VE linearizer 921. For instance, the multi-port PA DCR system 900 may comprise a first multi-port PA 924 ($PA_1$) associated with the main amplifier pre-processing block 902, which may receive a combined signal from two VE linearizers 922, e.g. $VE_{11}$ and $VE_{12}$. Similarly, the multi-port PA DCR system 900 may comprise a second multi-port PA 924 ($PA_2$) associated with the peaking amplifier pre-processing block 904, which may receive a combined signal from two other VE linearizers 922, e.g. $VE_{21}$ and $VE_{22}$.

Figure 10:
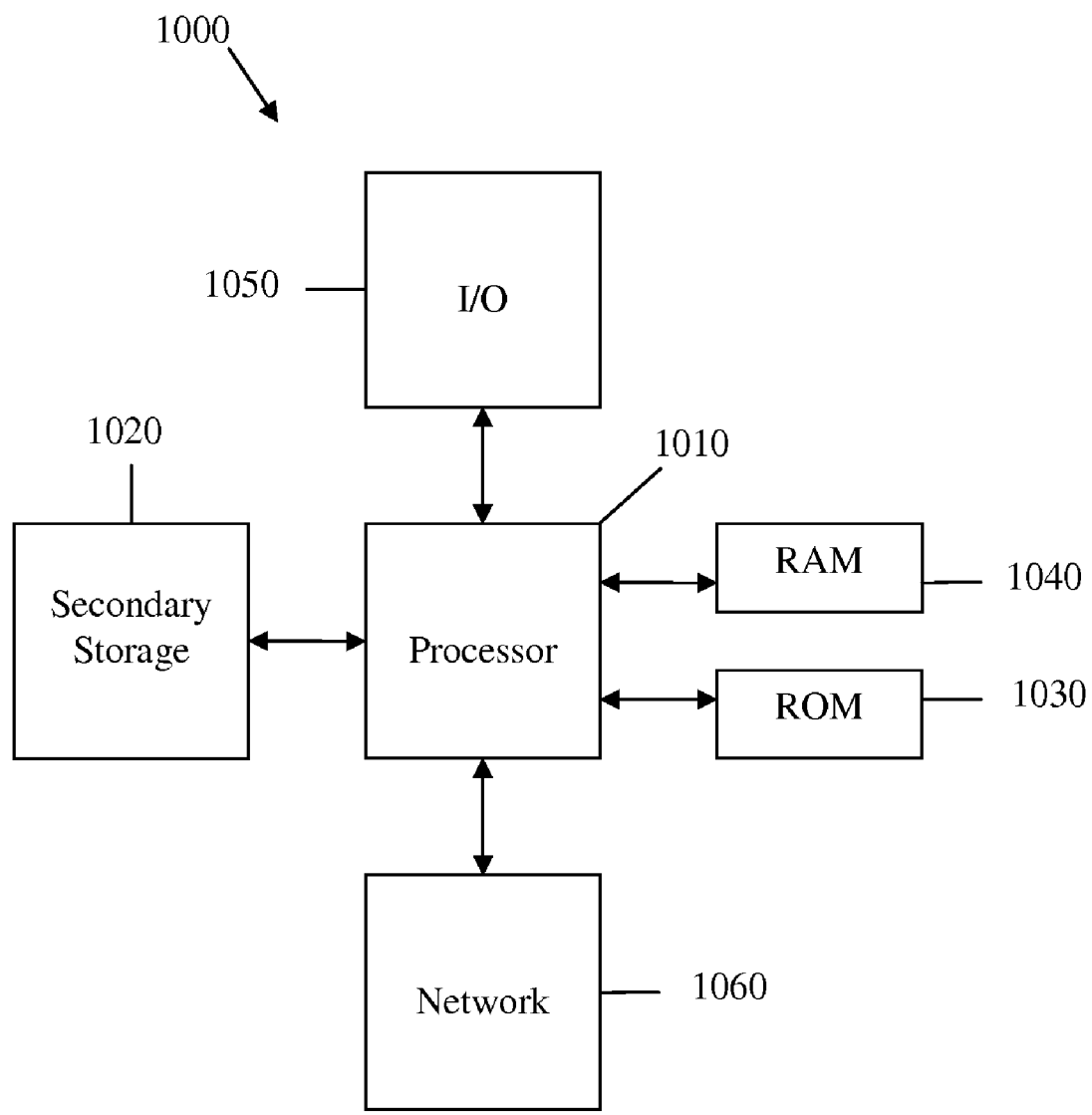
FIG. 10 is an illustration of an embodiment of a general-purpose computer system.

At least some of the system components described above, such as a component of a VE linearizer, may be implemented on any general-purpose network component, such as a computer or network component with sufficient processing power, memory resources, and network throughput capability to handle the necessary workload placed upon it. FIG. 10 illustrates a typical, general-purpose network component 1000 suitable for implementing one or more embodiments of the components disclosed herein. The network component 1000 includes a processor 1010 (which may be referred to as a central processor unit or CPU) that is in communication with memory devices including secondary storage 1020, read only memory (ROM) 1030, random access memory (RAM) 1040, input/output (I/O) devices 1050, and network connectivity devices 1060. The processor 1010 may be implemented as one or more CPU chips, or may be part of one or more ASICs.

The secondary storage 1020 is typically comprised of one or more disk drives or tape drives and is used for non-volatile storage of data and as an over-flow data storage device if RAM 1040 is not large enough to hold all working data. Secondary storage 1020 may be used to store programs that are loaded into RAM 1040 when such programs are selected for execution. The ROM 1050 is used to store instructions and perhaps data that are read during program execution. ROM 1050 is a non-volatile memory device that typically has a small memory capacity relative to the larger memory capacity of secondary storage 1020. The RAM 1040 is used to store volatile data and perhaps to store instructions. Access to both ROM 1030 and RAM 1040 is typically faster than to secondary storage 1020.

Additionally, at least some of the system components described herein may be implemented using at least one FPGA and/or ASIC. For instance, at least some of the system components may be implemented using point-by-point methods in one or more FPGAs, instead of using block based methods in a microprocessor. In other embodiments, at least some of the system components may be implemented using an internally integrated CPU or an external CPU chip.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of the term "optionally" with respect to any element of a claim is intended to mean that the subject element is not required. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A radio transmission system comprising:
a plurality of power amplifiers (PAs);
a plurality of Volterra Engine (VE) linearizers corresponding to the PAs;
a plurality of feedback loops corresponding to the PAs;
at least one digital hybrid matrix (DHM) coupled to the VE linearizers; and
an analog hybrid matrix (AHM) coupled to the PAs,
wherein the feedback loops are connected to the AHM and the VE linearizers but not to the PAs to reduce the number of feedback loops, wherein the DHM is coupled between the VE linearizers and the PAs, and wherein the feedback loops are coupled to the DHM.

2. The radio transmission system of claim 1 further comprising:
an additional DHM,
wherein the additional DHM couples the feedback loops to the VE linearizers, and
wherein the VE linearizers are coupled between the DHM and the PAs.

3. The radio transmission system of claim 2, wherein the VE linearizers receive a plurality of combined feedback signals from the additional DHM and use the combined feedback signals to adjust a plurality of corresponding combined input signals.

4. The radio transmission system of claim 1, wherein the VE linearizers receive a plurality of feedback signals from the AHM and use the feedback signals to adjust a plurality of corresponding input signals.

5. The radio transmission system of claim 1, wherein the VE linearizers are used to compensate for nonlinear or undesired signal effects introduced by the AHM.

6. The radio transmission system of claim 1, wherein the number of feedback loops is about equal to the number of AHM outputs.

7. The radio transmission system of claim 1, wherein reducing the number of feedback loops decreases nonlinear signal combining and cross talk, increases signal processing capacity, reduces system cost, or combinations thereof.

8. The radio transmission system of claim 1, wherein the radio transmission system is an agile radio head.

9. The radio transmission system of claim 8, wherein the radio transmission system is reconfigurable without hardware changes.

10. The radio transmission system of claim 9, wherein the radio transmission system is reconfigurable without hardware changes to support power combining.

11. The radio transmission system of claim 9, wherein the radio transmission system is reconfigurable without hardware changes to support beam forming.

12. The radio transmission system of claim 9, wherein the radio transmission system is reconfigurable without hardware changes to support sector power pooling.

13. The radio transmission system of claim 9, wherein the radio transmission system is reconfigurable without hardware changes to support power combining and beam forming.

14. The radio transmission system of claim 9, wherein the radio transmission system is reconfigurable without hardware changes to support beam forming and sector power pooling.

15. A radio system comprising:
a plurality of power amplifiers (PAs);
a Volterra digital hybrid matrix (VDHM) coupled to the PAs;
a plurality of feedback loops corresponding to the PAs; and
an analog hybrid matrix (AHM) coupled to the PAs,
wherein the feedback loops are connected to the AHM but not to the PAs to reduce the number of feedback loops,
further comprising an idea digital hybrid matrix (iDHM) coupled to the AHM and the VDHM,
wherein the iDHM processes a plurality of feedback signals corresponding to the feedback loops from the AHM in a fixed manner based on ideal AHM feedback signals, and wherein the VDHM is a delta VDHM ($\Delta$VDHM) and processes a plurality of input signals in an adaptive manner based on the feedback signals.

16. The radio system of claim 15, wherein the VDHM comprises:
a plurality of sets of Volterra Engine (VE) linearizers corresponding to the PAs; and
a plurality of couplers coupled to the sets of VE linearizers and the PAs,
wherein each set of VE linearizers comprises a plurality of VE linearizers, wherein each coupler connects one VE linearizer from each set of VE linearizers to one corresponding PA, and wherein the feedback loops are connected to the VDHM.

17. The radio system of claim 16, wherein each VE linearizer in a set of VE linearizers receives a component signal, substantially similar to an input signal associated with the set of VE linearizers, and wherein the component signals from one VE linearizer in each set of VE linearizers is combined at the corresponding coupler to obtain a combined signal for each PA.

18. The radio system of claim 16, wherein each set of VE linearizers is coupled to one corresponding feedback loop.

19. The radio system of claim 15, further comprising a second ideal digital hybrid matrix coupled to signal inputs and providing outputs that are coupled to the $\Delta$VDHM.

20. The radio system of claim 19, further comprising at least one peak power reduction block coupled between the second ideal digital hybrid matrix and the $\Delta$VDHM.

* * * * *